United States Patent

Helda

[15] 3,698,618

[45] Oct. 17, 1972

[54] FACE BONDING MACHINE

[72] Inventor: Robert W. Helda, Scottsdale, Ariz.

[73] Assignee: Motorola, Inc., Franklin Park, Ill.

[22] Filed: Nov. 29, 1971

[21] Appl. No.: 203,007

Related U.S. Application Data

[63] Continuation of Ser. No. 798,657, Feb. 12, 1969, abandoned.

[52] U.S. Cl. ........................228/3, 29/471.1, 29/626, 228/1, 228/44

[51] Int. Cl. ............................B23k 21/00, B23p 3/02

[58] Field of Search .......228/1, 3, 4, 5, 44; 29/471.1, 29/626, 577, 578, 509; 174/DIG. 6

[56] References Cited

UNITED STATES PATENTS 3,184,353 5/1965 Balamuth et al. ...........228/1 X
3,052,020 9/1962 Jones et al. ................228/1 X
2,946,119 7/1960 Jones et al. ................228/1 X

*Primary Examiner*—John F. Campbell
*Assistant Examiner*—R. J. Craig
*Attorney*—Mueller, Aichele & Gillman

[57] ABSTRACT

This disclosure discloses a method of bonding and a face bonding machine adapted to bond an integrated circuit die having a plurality of electrodes thereon to a substrate having a plurality of leads. The machine has a receptacle which mechanically registers the die in its bonding position on top of the substrate leads.

7 Claims, 6 Drawing Figures

INVENTOR.
Robert W. Helda
BY
Mueller, Aichele, & Rauner
Attys

INVENTOR.
Robert W. Helda
BY
Mueller, Aichele, & Rauner
Att'ys

INVENTOR.
Robert W. Helda
BY
Mueller, Aichele, & Rauner
Att'ys

FACE BONDING MACHINE

This is a continuation of Ser. No. 798,657 filed Feb. 12, 1969, now abandoned.

BACKGROUND

This invention relates to a bonding machine and a bonding method, and more particularly to a machine utilizing mechanical nesting of the die to effect the critical registration of mating die electrodes to substrate leads.

Heretofore, bonding machines which have bonded a die having a plurality of electrodes or pads thereon to a substrate having a plurality of leads have aligned or registered the die by optical means. Optical means have been employed to enable the operator to see the electrodes, since the die is upside down and the electrode pads are on the side of the die opposite the operator. One widely used optical method involves aligning the substrate to a given position by the use of a cross hair on an optical device and then aligning the die to another given position by means of the cross hair. The die and the substrate are spread apart while this optical alignment is being made and they are spread apart after the alignment has been completed. Then the die and the electrode are brought together, hopefully, in the same alignment. Another optical method involves a beam splitter which allows one to look at both the die and the substrate simultaneously. The parts are moved until they are in proper alignment and then the die is lowered until it comes in contact with the substrate. Both of the optical methods described above involve alignment of the die and the substrate while they are spread apart and assumes that the alignment does not change as a result of the die and the substrate being brought together.

It is a basic object of this invention to provide an improved bonding machine. It is another object of this invention to provide a machine which registers the mating die electrodes directly on top of the substrate leads. It is yet another object of this invention to provide an improved method of bonding which includes mechanically orienting a die to a mating substrate. It is a further object of this invention to provide a bonding machine having a bonding anvil and a bonding needle which are substantially co-planar.

These and other objects are accomplished by a bonding machine in which the critical registration of the die to the substrate is accomplished mechanically by the use of a tongue structure or receptacle positioned directly above the substrate which properly aligns the die electrode pads directly on top of the substrate leads in the desired position. The bonding machine has a substantially flat support surface for supporting a substantially flat substrate such as a metal frame member having a plurality of inwardly extending lead portions. A portion of the support surface serves as a bottom anvil under bonding conditions. There are two locating pin members which protrude or extend through the support surface which are designed to locate and position the substrate and its lead portions in a specific position on the bottom anvil. The machine has a bonding needle directly above the bottom anvil which is adapted for vertical movement so that during the bonding cycle the end of the needle and the face of the bottom anvil are substantially co-planar. This bonding machine provides a high speed reliable method for accurately positioning a die directly on a substrate and for bonding a die to a substrate having a plurality of leads.

Other objects and advantages of this invention will be more apparent from the following detailed description, reference being made to the accompanying drawings wherein a preferred embodiment of this invention is shown.

IN THE DRAWINGS

Figure 1:
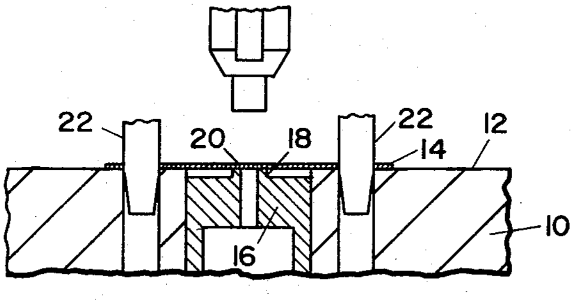
FIG. 1 is a side view of the bonding machine partly in cross section and partly in elevation showing the relative position of the locating pin members to the frame member which is to be bonded.
Figure 2:
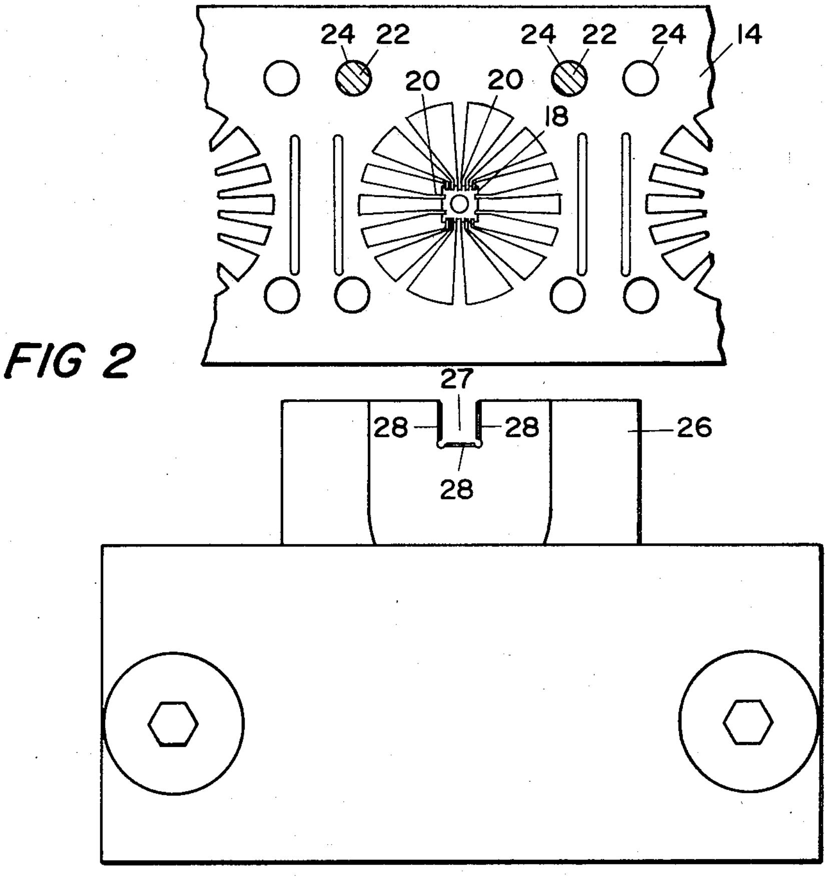
FIG. 2 is a top view of the machine as described in FIG. 1.

Referring to FIGS. 1 and 2 of the drawings, the bonding machine 10 comprises the substantially flat support surface 12 which provides support for substantially flat substrates such as a metal frame member 14. The machine has a lower bonding anvil 16 having a portion 18 which provides support for the frame member lead portions 20 and the die (not shown). Machine locating pin members 22 extend through the support surface 12 and through the frame member indexing holes 24 thereby positioning the metal frame member 14 and the lead portions 20 in a specific position or location on the bonding anvil portion 18. The locating pin members 22 are adapted for vertical movement so as to be able to withdraw from the surface 12 and out of the frame opening 24 after the bonding cycle has been completed. In the preferred embodiment the locating pin members move upward out of the supporting surface 12. This invention is not limited thereto.

A die receiving receptacle 26 has a rectangular shaped slot 27 formed by walls 28. The size of the slot 27 accommodates a die which is accurately positioned therein. The receptacle 27 is positioned a distance away from the frame member supporting surface while the frame member 14 is being positioned by means of locating pin members 22.

Figure 3:
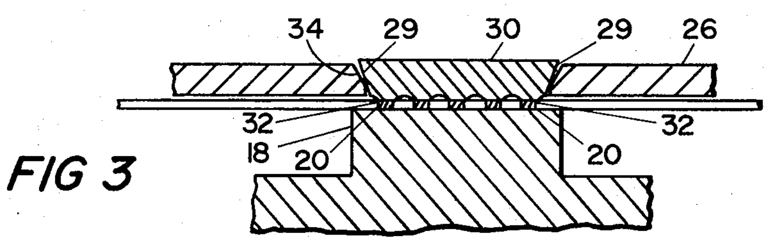
FIG. 3 is an enlarged side view of the bonding machine partly in cross section and partly in elevation showing the relative position of the die receptacle to the bonding anvil.
Figure 4:
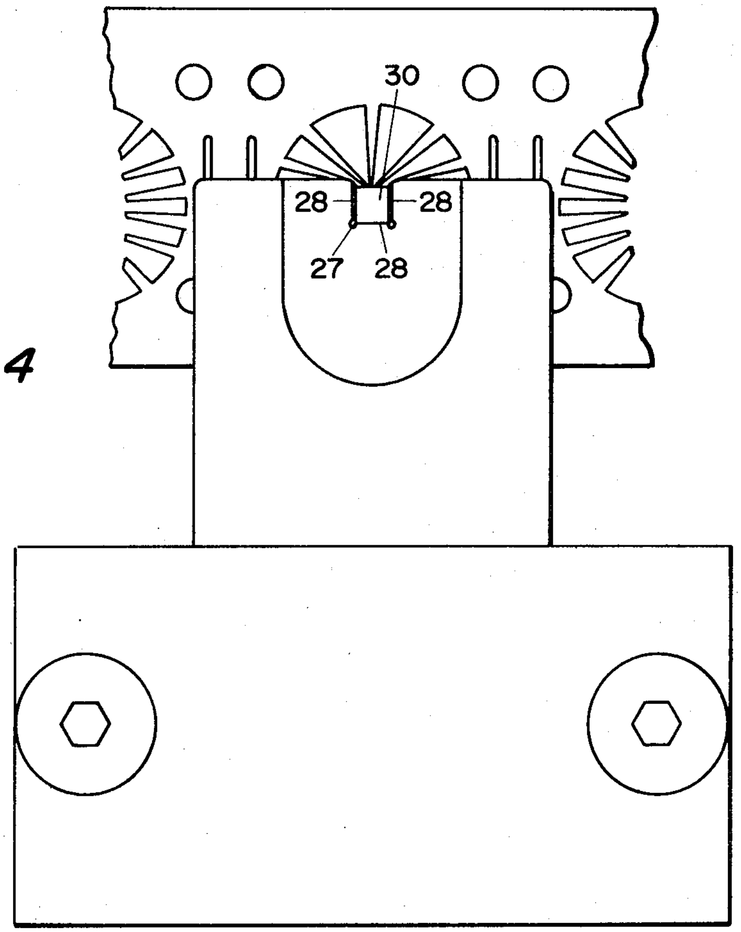
FIG. 4 is a top view of the machine as described in FIG. 3.

As shown in FIGS. 3 and 4, the die receiving receptacle 26 is moved manually to a given position directly above the lower bonding anvil portion 18 so that the walls 28 of the slot 27 encircle the frame member lead portions 20. After the die receiving receptacle 26 is in proper position above the frame member lead portions 20, a die 30 is placed into the slot 27. The die 30 has a plurality of electrodes or pads 32 thereon, for example, 12 or 14 electrodes all on one side of the die. The die 30 is placed into the slot 27 so that the electrodes 32 face the lead portions 20. In other words, the die is placed upside down as is the standard practice in the "-flip-chip" bonding process art. The walls 28 of the slot 27 have an upper wall portion 29 which are tapered to permit the slot 27 to accommodate dice having irregular edges due to scribe cutting. The receptacle walls 28 have a lower portion 34 which is substantially vertical. The slot 27 formed by wall portions 34 is designed to accommodate the die edges which were cut by the scribe which are accurate and predictable. Since the die edges which are cut by the scribe are relatively precise, the wall portions 34 accurately and precisely locate the die and the corresponding electrodes 32 in a given position with certain tolerances that are determined by the design of the substrate lead portions and the die electrodes to produce an overall acceptable yield. The wall portion 34 forms the slot 27 which locates the die in a specific position so that the electrode pads 32 are in physical contact with frame member lead portions 20. The die receptacle 26 effects a critical registration of the mating parts simply and efficiently.

Figure 5:
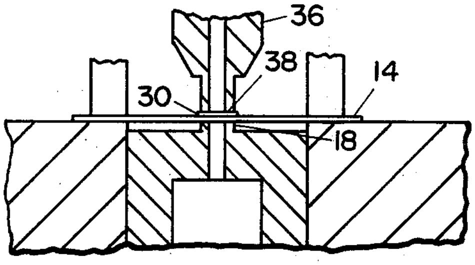
FIG. 5 is a side view of a bonding machine partly in cross section and partly in elevation showing the position of the bonding needle and the die receptacle during the bonding cycle.
Figure 6:
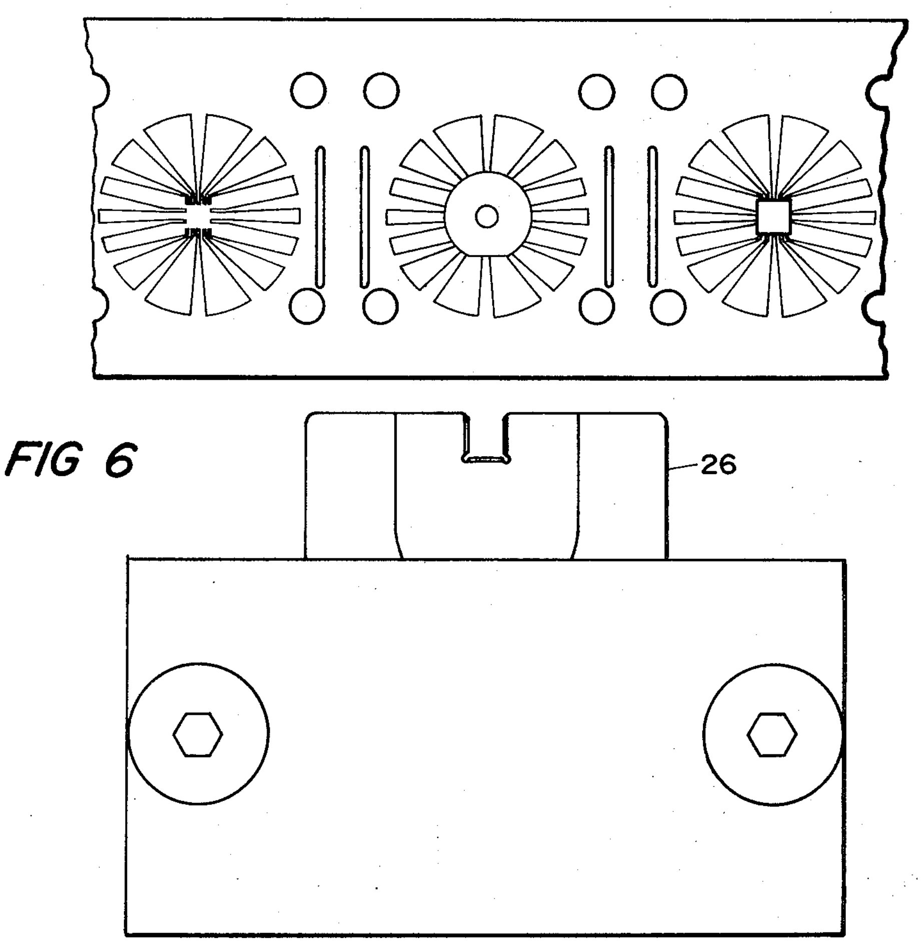
FIG. 6 is a top view of the machine as described in FIG. 5.

As shown in FIGS. 5 and 6, the bonding needle 36 is moved vertically downward so that the end 38 is positioned directly on top of die 30 thereby firmly holding the die 30 to lead portions 20 and bonding anvil 18.

The locating pins 22 continue to retain the lead frame 14 and the lead portions 20 in the specified position while at the same time bonding needle 36 maintains the die in the same specified position that the die receptacle 26 had located it. After the bonding needle has made a firm and retaining contact with the die, the die receptacle 26 is moved horizontally away from the die and the frame member. This step is optional although in the preferred embodiment this step is included since improved bonding results were obtained thereby.

The die bonding machine is then energized in the conventional manner and the die electrodes are ultrasonically bonded to the lead portions of the frame member. The bonding needle 38 is adapted for vertical movement preferably in order to have the bonding needle 38 substantially co-planar with the bonding anvil portion surface 18. The needle and the bonding anvil are separated by the die, and lead portions thereby being substantially co-planar. The advantage of the vertical movement of the bonding needle is that the co-planar characteristics are substantially increased in contrast to the bonding needles normally used in optical means which utilize pivotal mountings.

The bonding machine described in this invention has a number of advantages. One primary advantage is that the die is aligned directly onto the substrate lead portions by mechanical means thereby eliminating the possibility of misalignment of the type that is possible in the optical means when the die and lead portions are aligned while they are spaced apart and then brought together. This positive alignment or registration of mating die electrodes to a plurality of lead portions has advantages over prior art methods since it permits a high speed reliable method for registration for face or multiple lead bonding which requires extreme co-planarity. The tongue or die receiving receptacle feature of the machine eliminates the use of a microscope in making the critical registration of the die electrodes and the leads. This is an advantage since it eliminates the time required by the operator to focus the microscope and it also eliminates the rejects due to improper focusing by the operator. This feature permits registration with the use of normal vision. The operation of this machine is simple and avoids the use of expensive optical devices for registration.

While the invention has been described in terms of a specific embodiment the scope of the invention is defined in the following claims.

I claim:

1. A machine for simultaneously bonding together multiple individual lead portions in a group of such lead portions predetermined in number in a metallic member and the multiple electrodes on one face of a semiconductor unit wherein the electrodes correspond in number to the lead portions in a group in said metallic member, with said metallic member being provided in an elongated strip form defined by two longitudinal edges and with a plurality of such groups of lead portions being spaced apart from one another longitudinally over the elongated strip form and with the lead portions in each group converging toward the center area of the group, said machine having a supporting surface for supporting a metallic member in a flat position thereon and having means for successively indexing the bonding position of a group of lead portions as the metallic member is fed through the machine, with said single group of lead portions at such bonding position on the supporting surface adapted to be bonded to the electrodes of a semiconductor unit, positioning means in the machine for orienting a semiconductor unit and positioning the electrodes of the semiconductor unit in contact with the corresponding lead portions in the group in the metallic member positioned to be bonded, a bonding support for contacting all lead portions in on the semiconductor group on the side of each opposite to the side against which the electrodes are in contact, and bonding means in the machine located at the face of the semiconductor unit opposite to the face having the electrodes thereon to be operated to simultaneously bond together all lead portions and corresponding electrodes ductor unit, with said machine adapted to successively and repetitively bond the electrodes of a semiconductor unit to corresponding plurality of lead portions in each of the plurality of groups in the elongated strip form metallic member as such member is moved through the machine and semiconductor units are oriented and positioned in the machine to be bonded.

2. A machine for processing therein an elongated metallic member in strip form having a body portion and a plurality of groups of lead portions integral with the body portion and spaced apart over the length of such body portion and a plurality of semiconductor units adapted to be individually bonded to the lead portions of said metallic member, with each group of lead portions extending toward a central area in the group and each such semiconductor unit having a plurality of electrodes on one face thereof, with said electrodes of a semiconductor unit adapted to be simultaneously bonded to corresponding lead portions in a group adjacent the central area in the group, whereby successive individual semiconductor units can be bonded to successive groups of lead portions in the metallic member, said machine having a supporting surface thereon for the movement thereover and support of a metallic member, and having indexing means for positioning a metallic member in a position to have a semiconductor unit bonded thereto, receptacle means in the machine for receiving a semiconductor unit and positioning the same so as to have the electrodes thereon oriented relative to respective lead portions in a group on the metallic member and in contact with the end portions of the respective lead portions, and means in the machine for maintaining a semiconductor unit in contact with the lead portions at the electrodes and simultaneously bonding the electrodes of a unit and lead portions in a group together.

3. In a machine as defined in claim 1, wherein said bonding means includes bonding structure for directly engaging the face of a semiconductor unit opposite to the face upon which the electrodes are formed and operating on that face to secure an electrode and a lead portion together.

4. In a machine as defined in claim 1, means for engaging the lead portions of a group on a metallic member on the side of each lead portion opposite to the side engaging an electrode of a semiconductor unit, and adapted to maintain the lead portions in fixed position during the operation of said bonding structure.

5. In a machine as defined in claim 1, wherein said positioning means includes a receptacle portion with sidewalls forming the receptacle in said portion and acting to orient a semiconductor unit when placed therein, said receptacle portion being movable relative to the lead portions of a group to position the semiconductor unit at said lead portions with the electrodes in position at the ends of said lead portions adjacent the central area.

6. A machine for bonding together in single successive bonding operations a plurality of lead portions in a single group of lead portions with an elongated lead frame member and a corresponding plurality of electrodes on one face of each of a plurality of individual semiconductor units, with the lead portions in each group extending from an outside frame portion toward an open central area in the group and with the elongated frame member being defined by two longitudinal edges spaced apart generally by the width of a group of lead portions plus the outside frame portion having indexing holes therein, said machine having supporting surface means for the movement thereover and support thereon of the elongated lead frame member, having means utilizing the indexing holes for positioning and maintaining such elongated lead frame member on the supporting surface means with a group of lead portions in bonding position, having means for positioning a semiconductor unit so as to have the electrodes thereon oriented relative to the respective lead portions in a single group on the elongated frame member and in contact with the end portions of such respective lead portions, and having bonding means and anvil means for maintaining the electrodes of a semiconductor unit in contact with the lead portions at the electrodes for the bonding together in a single bonding operation such electrodes of a unit and such lead portions in a group, with one of said two latter means being movable in a direction at right angles to the material to be bonded to provide said two latter means relative to one another in bonding position, and with said machine adapted to successively release said elongated lead frame member after a bonding operation and successively reposition and maintain said member in position for another single bonding operation of the plurality of electrodes in a semiconductor unit and a plurality of lead portions in a single group with said frame member.

7. In a machine as defined in claim 3, means for engaging the lead portions of a group on a metallic member on the side of each lead portion opposite to the side engaging an electrode of a semiconductor unit, and adapted to maintain the the lead portions in fixed position during the operation of said bonding structure.

* * * * *

UNITED STATES PATENT OFFICE
CERTIFICATE OF CORRECTION

Patent No. 3,698,618 Dated October 17, 1972

Inventor(s) ROBERT W. HELDA

It is certified that error appears in the above-identified patent and that said Letters Patent are hereby corrected as shown below:

Column 4, line 35, cancel "on the semiconductor" and insert -- a -- ; line 41, after "electrodes", insert -- on the semicon -- .

Signed and sealed this 6th day of August 1974.

(SEAL)
Attest:

McCOY M. GIBSON, JR.
Attesting Officer

C. MARSHALL DANN
Commissioner of Patents

FORM PO-1050 (10-69)
USCOMM-DC 60376-P69
☆ U.S. GOVERNMENT PRINTING OFFICE : 1969 O—366-334.